United States Patent [19]

Rastani

[11] Patent Number: 5,073,041
[45] Date of Patent: Dec. 17, 1991

[54] INTEGRATED ASSEMBLY COMPRISING VERTICAL CAVITY SURFACE-EMITTING LASER ARRAY WITH FRESNEL MICROLENSES

[75] Inventor: Kasra Rastani, Freehold, N.J.

[73] Assignee: Bell Communications Research, Inc., Livingston, N.J.

[21] Appl. No.: 612,924

[22] Filed: Nov. 13, 1990

[51] Int. Cl.$^5$ .............................................. H01S 3/125
[52] U.S. Cl. ...................................... 385/33; 385/31; 372/43; 372/101
[58] Field of Search ............... 350/96.18, 96.15, 96.16, 350/96.14; 372/43, 44, 49, 50, 98, 101

[56] References Cited

U.S. PATENT DOCUMENTS

| | | | |
|---|---|---|---|
| 4,943,133 | 6/1990 | Deri et al. | 350/96.14 |
| 4,949,350 | 8/1990 | Jewell et al. | 372/45 |
| 4,991,921 | 2/1991 | Suzuki et al. | 350/96.14 |
| 4,997,246 | 3/1991 | May et al. | 350/96.14 |

OTHER PUBLICATIONS

"Low-Wavefront Aberration and High-Temperature Stability Molded Micro Fresnel Lens," M. Tanigami et al., IEEE Photo. Tech. Lett., vol. 1, No. 11, pp. 384-385, Nov. 1989.
"Fabrication of Miniature Lenses and Mirrors for In-GaAsP/InP Lasers," D. Yap, et al., Mini. Optics & Lasers, SPIE, vol. 898, pp. 18-22, 1988.
"Grating Lenses for the Semiconductor Laser Wavelength," Gen-ichi Hatakoshi, et al., Applied Optics, vol. 24, No. 24, pp. 4307-4310, Dec. 15, 1985.
"Vertical-Cavity Surface-Emitting InGaAs/GaAs Lasers with Planar Lateral Definition," M. Orenstein et al., Appl. Phys. Lett. 56(24), pp. 2384-2386, Jun. 11, 1990.
"Optical Computing and Related Microoptic Devices," J. L. Jewell et al., MOC/GRIN '89 Tokyo, pp. 238-241, 1989.
"Microcollimated Laser Diode with Low Wavefront Aberration," S. Ogata et al., IEEE Photo. Tech. Lett., vol. 1, No. 11, pp. 354-355, Nov. 1989.

Primary Examiner—Frank Gonzalez
Assistant Examiner—Phan T. Heartney
Attorney, Agent, or Firm—Leonard Charles Suchyta; James W. Falk

[57] ABSTRACT

An array of Fresnel microlenses is fabricated directly on the planar output surface of an array of vertical cavity surface-emitting lasers. A compact integrated assembly comprising precisely aligned lasers and lenses is thereby provided for focusing (or collimating) the output beams of the lasers.

6 Claims, 5 Drawing Sheets

INTEGRATED ASSEMBLY COMPRISING VERTICAL CAVITY SURFACE-EMITTING LASER ARRAY WITH FRESNEL MICROLENSES

BACKGROUND OF THE INVENTION

This invention relates to lasers and, more particularly, to lasers of the vertical cavity surface-emitting type.

The development of vertical cavity surface-emitting lasers has made it possible to fabricate optical sources characterized by extremely small size and high output power. Additionally, multiple such sources can be conveniently integrated in a single chip to form two-dimensional arrays useful for a wide variety of optical information processing, interconnection and communication applications. Techniques for making and using such sources are well known in the art, as described, for example, in U.S. Pat. No. 4,949,350, entitled Surface-Emitting Semiconductor Laser, issued to J. L. Jewell and A. Scherer, and in an article by H. Orenstein, A. C. Von Lehmen, C. Chang-Hasnain, N. G. Stoffel, J. P. Harbison, L. T. Florez, E. Clausen and J. L. Jewell, entitled Vertical Cavity Surface-Emitting InGaAs/GaAs Lasers with Planar Lateral Definition, which appears in Appl. Phys. Lett. 56,2384 (1990).

Due to diffraction effects, the individual beams provided by the surface-emitting lasers of an integrated array exhibit a relatively high degree of divergence as they emerge from the planar output surface of the array. In practice, such divergence often causes deleterious effects such as crosstalk among the output beams to occur.

Accordingly, attempts have been made to focus or collimate the output beams of a vertical cavity surface-emitting laser array to avoid the practical problems caused by the divergence phenomenon. But heretofore all such efforts have involved the use of a separate lens array spaced apart from the laser array thereby to form a hybrid assembly for achieving the desired focusing or collimation.

The separate lens array included in such a hybrid assembly is typically bulky, difficult to fabricate, and difficult to maintain in precise alignment with the individual sources of the associated laser array. Hence, efforts have continued to try to devise other more suitable arrangements for controlling the output beams of a surface-emitting laser array. In particular, these efforts have been directed at trying to develop an easily fabricated, rugged, compact, microminiature assembly capable of both generating and shaping the laser output beams to exhibit the requisite focused or collimated shape.

SUMMARY OF THE INVENTION

In accordance with the principles of the present invention, an array of Fresnel microlenses is fabricated directly on the planar output surface of an array of surface-emitting lasers. In that way, a compact integrated assembly comprising precisely aligned lasers and lenses is provided.

In accordance with one feature of the invention, the microlenses included in the integrated assembly comprise simple binary-phase Fresnel lenses. Each such lens includes a set of concentric vertically walled grooves.

BRIEF DESCRIPTION OF THE DRAWING

A complete understanding of the present invention and of the above and other features thereof will be apparent from a consideration of the detailed description below taken in conjunction with the accompanying drawing, not drawn to scale, in which.

DETAILED DESCRIPTION

Figure 1:
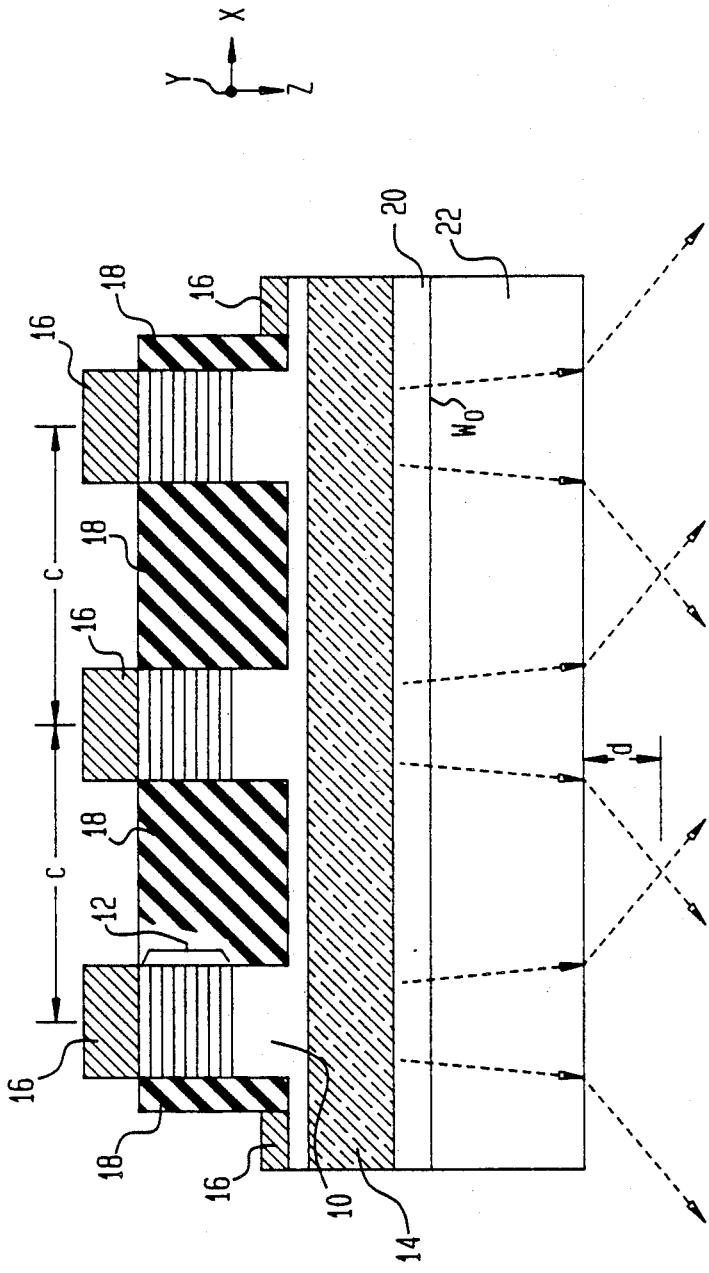
FIG. 1 is a cross-sectional side view of a conventional array of vertical cavity surface-emitting lasers.

FIG. 1 represents a conventional array of vertical cavity surface-emitting lasers. Illustratively, an X-Y array of spaced-apart lasers is depicted. By way of example, the pitch size of the array is about 100 micrometers ($\mu$m). Thus, the center-to-center X-direction distance c of the particular three lasers show in FIG. 1 is 100 $\mu$m.

The individual lasers of the array represented in FIG. 1 are identical to each other. As is well known, each such laser comprises an active region sandwiched between mirrors, thereby to form in effect a resonant cavity. Thus, for example, the lefthand laser of FIG. 1 comprises active region 10 (which consists of InGaAs quantum wells separated by GaAs spacers), a highly reflective upper mirror 12 that includes multiple alternating layers of GaAs and AlGaAs which is Be p-doped, and a less highly reflective lower mirror 14 which is similar in composition to the upper mirror except that it is Si n-doped. The lower mirror allows some of the light generated in the laser to be emitted downward in the Z direction.

The conventional FIG. 1 array further includes electrical contacts 16 made, for example, of gold, ion-damaged isolation regions 18 surrounding the lasers, a buffer layer 20 made of n-type GaAs and a GaAs substrate 22 which has high transmissivity at the wavelength emitted by the laser. Each of the indicated lasers provides a Z-direction output beam that is emitted from the bottom X-Y planar surface of the substrate 22. For the lowest transverse-mode laser operation, each such output beam may be approximated as being Gaussian in nature.

The width or waist of each Gaussian beam (measured to $1/e^2$ of its intensity, where $e = 2.7182$) at the interface between the layer 20 and the substrate 22 of FIG. 1 is $W_o$. In one particular illustrative example, the waist $W_o$ is 10 $\mu$m in a GaAs substrate ($n = 3.5$) for a beam wavelength in free space of 0.98 $\mu$m.

Due to diffraction from the output aperture of each resonator, the beam provided by each laser of the FIG. 1 array diverges in the GaAs substrate 22. Thus, a 10-$\mu$m-wide Gaussian beam emitted from each resonator at 0.98 μm exhibits a full divergence angle of about one degree in the GaAs substrate 22 (whose index of refraction is 3.5). After exiting from the bottom surface of the substrate 22 and entering air, each beam diverges even more. In air, the full divergence angle of each beam is about four degrees. (For a planar wave emitted from a 10-μm-aperture laser, the full divergence angle in air would be considerably greater, about eleven degrees.)

The aforementioned diffraction phenomenon is illustrated in FIG. 1 wherein dash lines denote the profile of each emitted laser beam. In particular, the dash lines indicate where the intensity of each beam has dropped to $1/e^2$ the value at the beam center. As a result of this phenomenon, the exiting beams interfere with each other at a relatively short distance downstream of the output face of the array. Such interference causes crosstalk and other deleterious effects. In practical embodiments of laser arrays as heretofore constructed, such interference occurs at a distance d (FIG. 1) from the output face. For example, for a laser array pitch of 100 μm, d is about 1.7 millimeters.

Figure 2:
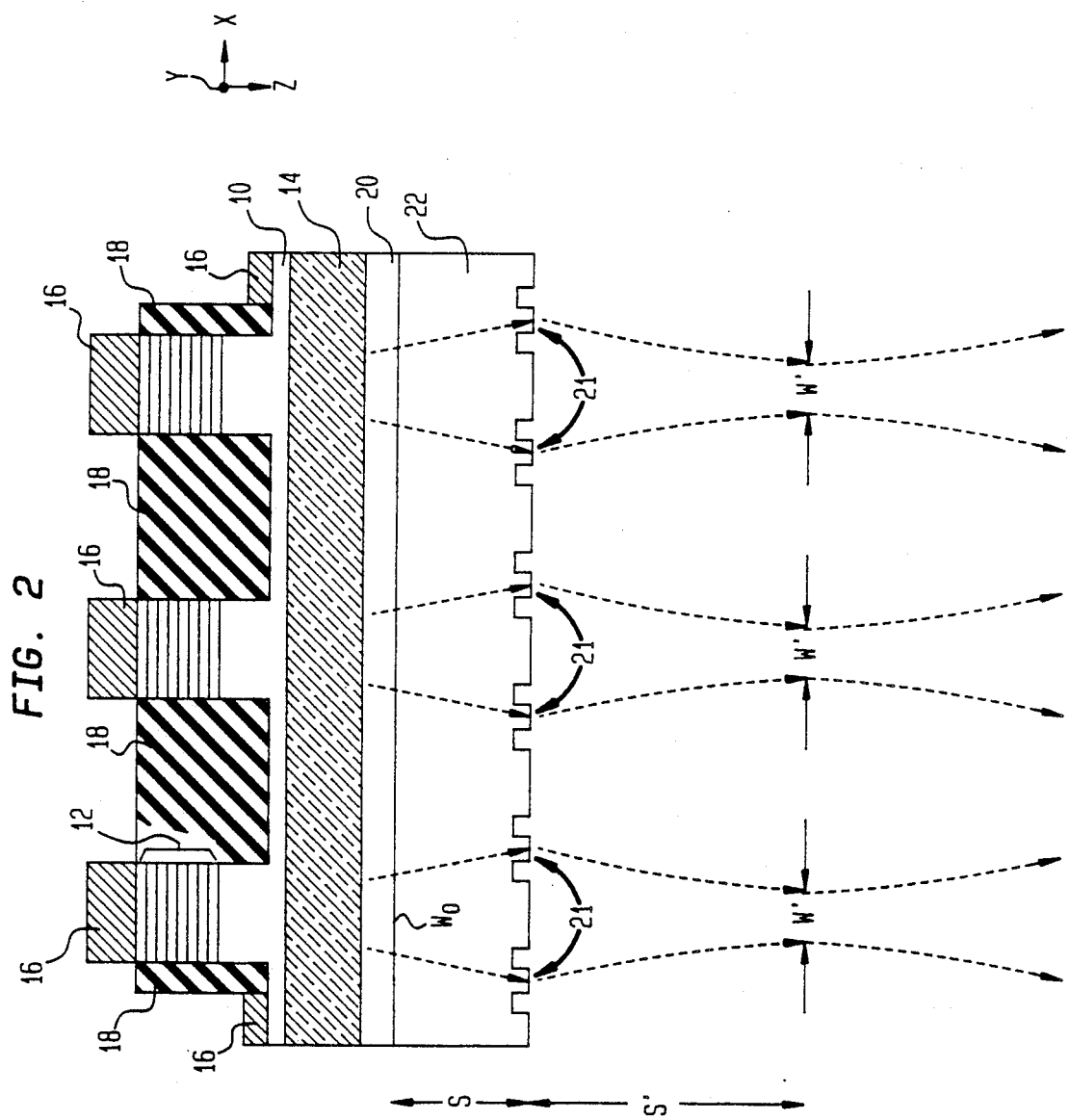
FIG. 2 is a simplified showing of an array of the FIG. 1 type modified in accordance with the principles of the present invention to form an integrated laser-lens assembly.

FIG. 2 shows a laser array of the FIG. 1 type modified in accordance with the principles of the present invention. Elements in FIG. 2 that are identical to previously described corresponding ones shown in FIG. 1 are designated in FIG. 2 with the same reference numerals.

In accordance with this invention, individual Fresnel microlenses are fabricated on the bottom planar surface of the substrate 22 in respective alignment with the lasers included in the depicted array. Initially, for illustrative purposes, emphasis will be directed to the design of lenses that serve to focus these output beams. Later below, mention will be made of how to modify this design to achieve collimated output beams.

In accordance with one feature of the invention, symmetrical so-called binary-phase Fresnel lenses 21 are fabricated on the bottom surface of the substrate 22 of FIG. 2 in respective alignment with the aforedescribed lasers. In one embodiment, each such lens comprises a series of concentric circular grooves formed in the bottom surface of the substrate 22. Such grooves are easily formed in conventional ways by standard photolithographic and ion milling techniques.

For purposes of simplification and so as not to unduly clutter the drawing, each of the three identical lenses 21 shown in FIG. 2 is schematically depicted as including only two concentric grooves. To achieve practical diffraction efficiencies, however, each such lens actually includes multiple such grooves (at least about ten). If fewer grooves are utilized, aberrations result accompanied by an increase in focal spot size. Advantageously, the depths of all the grooves are the same.

To focus a Gaussian beam, the groove depth needed in a binary-phase Fresnel lens to achieve a $(2i+1)\pi$ phase shift, where i equals 0 or any positive integer, is given by the expression $$\frac{\lambda}{2(n-1)} \quad (1)$$

where λ is the wavelength of the output of the associated laser, and n is the index of refraction of the material in which the grooves are formed. For GaAs (n=3.5) and for a λ of 0.98 μm, the depth of each groove in the herein-considered illustrative embodiment is 0.196 μm.

Assume, for example, that it is desired to focus the Gaussian output beams provided by the FIG. 2 assembly at a distance S' in the Z direction from the planar output face of the substrate 22. The waist or width of each of these focused beams at the distance S' is designated W'. The focal length f of the Fresnel lens required to achieve such focusing is obtained from the expression $$\frac{S'}{f} = \frac{S(S-nf) + \frac{\pi^2 W_o^4}{\lambda^2}}{(S-nf)^2 + \frac{\pi^2 W_o^4}{\lambda^2}} \quad (2)$$

where λ, $W_o$, n and S' are as specified above, and S is the Z-direction thickness of the substrate 22. In turn, the new waist size of the focused beam at the distance S' is given by the expression $$W' = \frac{W_o f}{\left\{(S-nf)^2 + \frac{\pi^2 W_o^4}{\lambda^2}\right\}^{\frac{1}{2}}} \quad (3)$$

By utilizing the design criteria specified above, it is feasible to fabricate an integrated laser-lens assembly of the type shown in FIG. 2 to focus output beams at specified distances from the output face of the assembly. In that way, the output beams can be coupled, for example, to associated optical fibers and detectors in a precisely controlled and efficient manner.

In a specific illustrative example in which $W_o=10$ μm, λ=0.98 μm, n=3.5, S=300 μm, S'=106 μm and f=108 μm, the new waist size W' of a Gaussian output beam provided by the FIG. 2 assembly is approximately one μm. In practice, such focusing can be achieved with an array of simple identical binary-phase Fresnel microlenses. The structure of one such microlens 25 is represented in FIG. 3.

Figure 3:
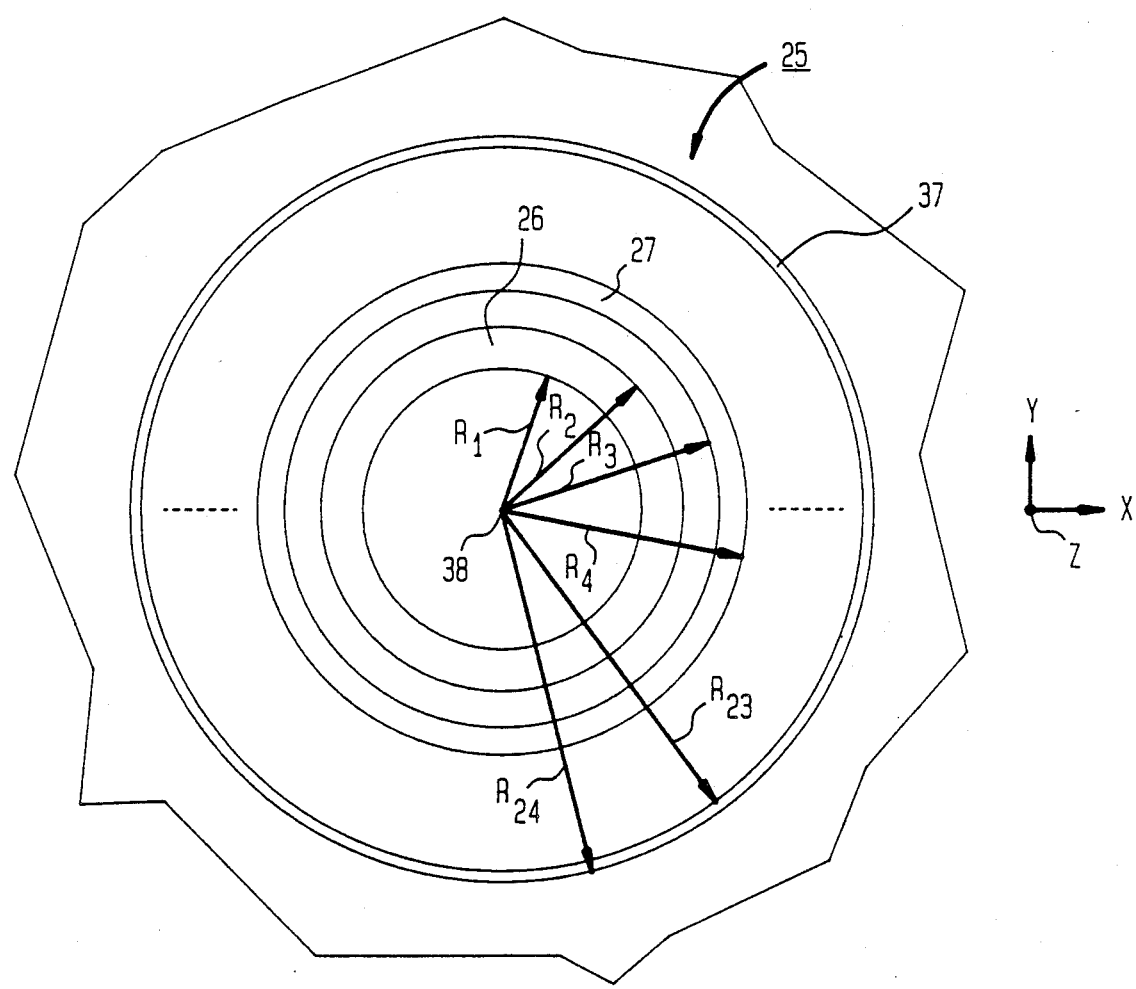
FIG. 3 is a bottom view of a binary-phase lens of the type included in the FIG. 2 assembly.

The binary phase Fresnel microlens 25 shown in FIG. 3 comprises multiple concentric vertically walled grooves constituting zones 26,27 . . . 37 each having the same Z-direction depth. To achieve practical diffraction efficiencies, the microlens of FIG. 3 includes, for example, fifteen such zones. The center point 38 of the symmetrical microlens 25 lies on the longitudinal Z-direction centerline of an associated one of the lasers included in the FIG. 2 array.

In FIG. 3, radial lines indicate the inner and outer bounds of each of the aforementioned zones. Thus, for example, radii $R_1$ and $R_2$ define the location of the vertical Z-direction surfaces that form the walls of the zone 26. Hence, the radii $R_1$ and $R_2$ define the width of the zone 26. Similarly, $R_3$ and $R_4$ define in effect the width of the zone 27, and $R_{23}$ and $R_{24}$ define the width of the zone 37.

The length of each of the radial lines $R_1$, $R_2$, $R_3$, $R_4$ . . . $R_{23}$ and $R_{24}$ shown in FIG. 3 can be determined from the expression $$R_m^2 = mf\lambda \quad (4)$$

where m=1,2,3,4 . . . 23,24, and f and λ are as defined earlier above. Thus, for example, for the particular example in which f=108 μm and λ=0.98 μm, $R_1^2=(108)(0.98)$ or $R_1=10.3$ μm. Similarly, $R_2=14.6$ μm. Thus, the width of the zone 26 is thereby defined as being 4.3 μm. In the same way, the zone 27 is determined to be radially spaced apart from the zone 26 by 3.2 μm, and the width of the zone 27 is calculated to be 2.8 μm. Further, the width of the outermost zone 37 is 1.1 μm, with the distance $R_{23}$ being 49.3 μm.

In the aforementioned arrangements, the output of each laser is focused at a new waist location that is symmetrically disposed with respect to the longitudinal centerline of the laser. Such focusing is accomplished with a centrally positioned symmetrical microlens of the type depicted in FIG. 3. Alternatively, in accordance with this invention, it is feasible to utilize microlenses to steer output beams to off-centerline locations. In that way, for example, two or more beams may be directed to a specified location for coupling into the same optical fiber.

Figure 4:
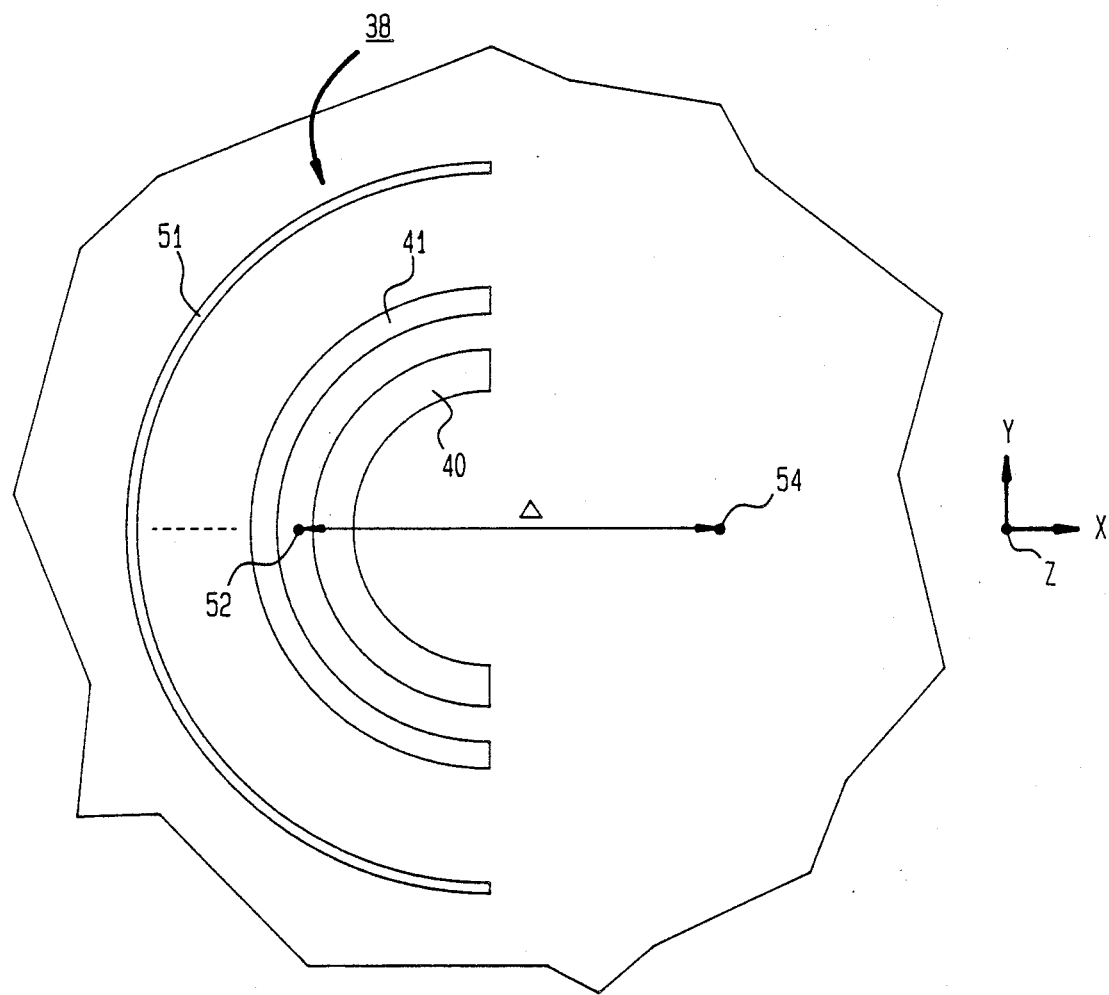
FIG. 4 depicts another form of binary-phase lens suitable for inclusion in the integrated assembly of FIG. 2.

FIG. 4 illustrates a portion of a Fresnel microlens suitable for such off-centerline focusing. The depicted microlens 38 includes multiple nested semicircular grooves 40, 41 . . . 51 that are arranged as shown with respect to a point 52 that lies on the longitudinal Z-direction centerline of an associated one of the lasers included in the FIG. 2 assembly. By means of such a microlens, it is possible to focus the output beam of a laser to a downstream location that is not centered with respect to the centerline of the laser. Thus, for example, the FIG. 4 microlens is effective to steer an output beam to a downstream location whose center point is displaced in the X direction from the point 52 by a distance Δ. Such an out-of-plane center point 54 is indicated in FIG. 4.

Figure 5:
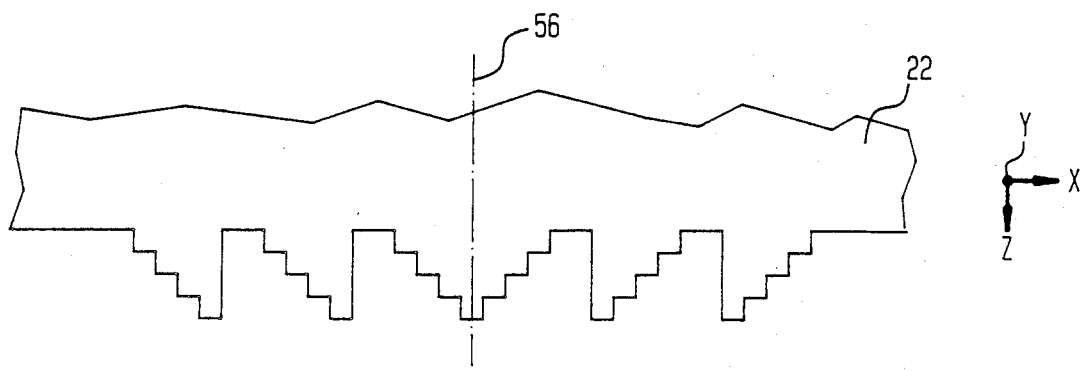
FIG. 5 represents a specific illustrative multiple-phase lens that may be included in an integrated assembly of the FIG. 2 type.

In accordance with the invention, microlenses that exhibit higher diffraction efficiencies than the simple binary-phase structures described above are feasible. A particular illustrative example of such a more-efficient microlens is represented in FIG. 5. The depicted structure constitutes a so-called multiple-phase microlens. In the multiple-phase structure, each of a series of concentric grooves formed in the substrate 22 of FIG. 2 includes on one side thereof multiple steps rather than a vertical wall as in the binary-phase arrangement. As indicated in FIG. 5, the multiple-phase microlens is, for example, formed in the substrate 22 in symmetrical alignment with respect to the centerline 56 of an associated laser.

Both the binary-phase and multiple-phase Fresnel microlens specified above are described for illustrative purposes as being formed by making grooves in the substrate 22 of FIG. 2. Alternatively, it is feasible to fabricate the microlenses by depositing a layer of material on the bottom surface of the substrate 22 and then patterning the layer in conventional ways to form the required grooves.

Figure 6:
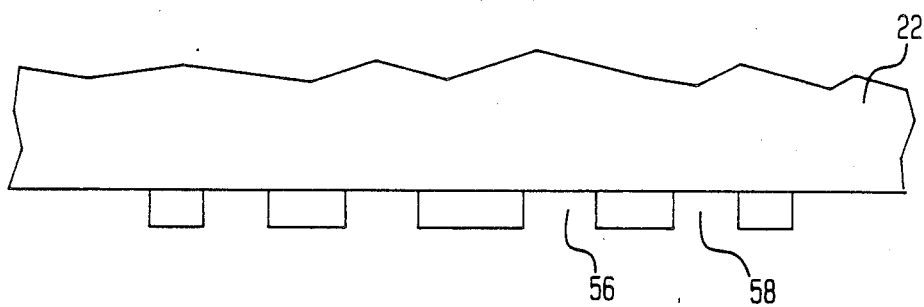
FIG. 6 shows another way in which a binary-phase lens may be formed on the bottom surface of the FIG. 2 assembly.

An illustrative such alternative structure is depicted in FIG. 6. As indicated there in simplified form, a layer deposited on the bottom surface of the substrate 22 has been patterned to form concentric grooves 56 and 58. By way of example, the patterned layer formed on the GaAs substrate 22 is made of a material such as $Si_3N_4$.

Finally, it is to be understood that the various specific arrangements and techniques described herein are only illustrative of the application of the principle of the present invention. In accordance with these principles, numerous alternatives and modifications may easily be made by those skilled in the art without departing from the spirit and scope of the invention. For example, although primary emphasis herein has been directed to utilizing Fresnel microlenses to focus the output beams from a laser array, it is also feasible to employ such microlenses to collimate the output beams. This is easily achieved by ensuring that the aforespecified distance S' is made smaller than the Rayleigh length b, where b is defined as $$\frac{\pi W_o^2}{\lambda} \tag{5}$$

and where $W_o$ and $\lambda$ are as defined earlier above.

What is claimed is:

1. An integrated laser-lens assembly comprising an array of vertical cavity surface-emitting lasers, each of said lasers comprising an active region sandwiched between a first mirror individual to each of said lasers and a second mirror common to all of said lasers and individual electrical contacts for each of said regions, a substrate having a high transmissivity at the wavelengths emitted by said lasers extending across said second mirror and integrally formed therewith, and a plurality of planar Fresnel microlenses formed in the outer surface of said substrate, each of said microlenses being in alignment with the individual electrical contact of one of said vertical cavity surface-emitting lasers and comprising means defining concentric zones.

2. An integrated laser-lens assembly in accordance with claim 1 wherein said zones are defined by a patterned layer formed on said outer surface.

3. An integrated laser-lens assembly in accordance with claim 1 wherein said zones constitute depressions formed in said outer surface.

4. An integrated laser-lens assembly in accordance with claim 1 wherein at least one of said microlenses comprises a structure having multiple nested semicircular grooves having a common center that does not lie on the center line of its respective aligned laser.

5. An integrated laser-lens assembly in accordance with claim 1 wherein said microlenses are of the binary-phase type and said means defining concentric zones includes continuous vertical walls each of the same depth in said outer surface.

6. An integrated laser-lens assembly in accordance with claim 1 wherein said microlenses are of the multiple-phase type and wherein each of said zones includes a stepped wall.

* * * * *